United States Patent
Ganta et al.

(10) Patent No.: US 11,451,239 B2
(45) Date of Patent: Sep. 20, 2022

(54) POWER REDUCTION AND PERFORMANCE ENHANCEMENT TECHNIQUES FOR DELTA SIGMA MODULATOR

(71) Applicant: Robert Bosch GmbH, Stuttgart (DE)

(72) Inventors: Saikrishna Ganta, Milpitas, CA (US); Man-Chia Chen, Palo Alto, CA (US); Chinwuba Ezekwe, Albany, CA (US)

(73) Assignee: Robert Bosch GmbH, Stuttgart (DE)

( * ) Notice: Subject to any disclaimer, the term of this patent is extended or adjusted under 35 U.S.C. 154(b) by 68 days.

(21) Appl. No.: 16/958,961

(22) PCT Filed: Dec. 27, 2018

(86) PCT No.: PCT/US2018/067635
§ 371 (c)(1),
(2) Date: Jun. 29, 2020

(87) PCT Pub. No.: WO2019/133685
PCT Pub. Date: Jul. 4, 2019

(65) Prior Publication Data
US 2020/0343904 A1    Oct. 29, 2020

Related U.S. Application Data

(60) Provisional application No. 62/611,586, filed on Dec. 29, 2017.

(51) Int. Cl.
*H03M 1/82* (2006.01)
*H03M 3/00* (2006.01)

(52) U.S. Cl.
CPC .............. *H03M 3/358* (2013.01); *H03M 3/34* (2013.01); *H03M 3/384* (2013.01); *H03M 3/424* (2013.01); *H03M 3/464* (2013.01)

(58) Field of Classification Search
CPC ........ H03M 3/358; H03M 3/34; H03M 3/384; H03M 3/424; H03M 3/464
See application file for complete search history.

(56) References Cited

U.S. PATENT DOCUMENTS

| | | | | |
|---|---|---|---|---|
| 10,439,634 | B2* | 10/2019 | Bolatkale | H03M 3/464 |
| 2009/0096648 | A1* | 4/2009 | Chandra | H03M 1/0663 |
| | | | | 341/143 |

(Continued)

OTHER PUBLICATIONS

International Search Report corresponding to PCT Application No. PCT/US2018/067635, dated May 1, 2019 (3 pages).

*Primary Examiner* — Joseph J Lauture
(74) *Attorney, Agent, or Firm* — Maginot, Moore & Beck LLP

(57) ABSTRACT

Reference scaling, op amp balancing and chopper stabilization techniques for delta-sigma modulators of analog-to-digital converters are provided. For reference scaling, unit elements in a feedback digital-to-analog (DAC) converter are driven by a reference voltage or disconnected from active circuitry to realize three DAC levels. While disconnected, the unit elements deliver no charge to the device which results in power saving and a reduction in thermal noise. Op amp balancing involves down-sampling the quantizer output followed by up-sampling on the feedback path and filtering to hold a DAC value of the signal for a duration of a sampling period to generate the feedback signal. Chopper stabilization is performed by chopping an operational transconductance amplifier of the integrator at a chopping frequency equal to the sampling frequency.

19 Claims, 12 Drawing Sheets

(56) References Cited

U.S. PATENT DOCUMENTS

2009/0140899 A1 6/2009 Ceballos et al.
2011/0001646 A1 1/2011 Koch
2013/0278454 A1 10/2013 Schmid et al.
2013/0335247 A1 12/2013 Ceballos et al.

* cited by examiner

| DAC CODE | CONTROL STATE | | | | | OFFSET ERROR CHARGE |
|---|---|---|---|---|---|---|
| | d1 | d2 | d3 | d4 | d5 | |
| 5 | 1 | 1 | 1 | 1 | 1 | $-5V_{os}C_u$ |
| 3 | 1 | 1 | 1 | 1 | 0 | $-5V_{os}C_u$ |
| 1 | 1 | 1 | 1 | 0 | 0 | $-5V_{os}C_u$ |
| -1 | 1 | 1 | 0 | 0 | 0 | $-5V_{os}C_u$ |
| -3 | 1 | 0 | 0 | 0 | 0 | $-5V_{os}C_u$ |
| -5 | 0 | 0 | 0 | 0 | 0 | $-5V_{os}C_u$ |

| DAC CODE | CONTROL STATE | | | | | OFFSET ERROR CHARGE |
|---|---|---|---|---|---|---|
| | d5p/d5n | d4p/d4n | d3p/d3n | d2p/d2n | d1p/d1n | |
| 5 | 1/0 | 1/0 | 1/0 | 1/0 | 1/0 | $-5V_{os}C_u$ |
| 3 | 1/0 | 1/0 | 1/0 | 0/0 | 0/0 | $-3V_{os}C_u$ |
| 1 | 1/0 | 0/0 | 0/0 | 0/0 | 0/0 | $-1V_{os}C_u$ |
| -1 | 0/1 | 0/0 | 0/0 | 0/0 | 0/0 | $-1V_{os}C_u$ |
| -3 | 0/1 | 0/1 | 0/1 | 0/0 | 0/0 | $-3V_{os}C_u$ |
| -5 | 0/1 | 0/1 | 0/1 | 0/1 | 0/1 | $-5V_{os}C_u$ |

| DAC CODE | CONTROL STATE | | | | OFFSET ERROR |
|---|---|---|---|---|---|
| | d4p/d4n | d3p/d3n | d2p/d2n | d1p/d1n | |
| 4 | 1/0 | 1/0 | 1/0 | 1/0 | -4Vos |
| 2 | 1/0 | 1/0 | 0/0 | 0/0 | -2Vos |
| 0 | 0/0 | 0/0 | 0/0 | 0/0 | -0Vos |
| -2 | 0/1 | 0/1 | 0/0 | 0/0 | -2Vos |
| -4 | 0/1 | 0/1 | 0/1 | 0/1 | -4Vos |

| TRANSFER FUNCTION | DELAYING INTEGRATOR EXAMPLE | NON-DELAYING INTEGRATOR EXAMPLE |
|---|---|---|
| $H_1(z)$ | $\dfrac{z^{-1}}{1-z^{-1}}$ | $\dfrac{1}{1-z^{-1}}$ |
| $H_c(z)$ | $\dfrac{1}{2}(1+z^{-1})z^{-1}$ | $\dfrac{1}{2}(1+z^{-1})$ |

| CLK | $\phi1$ | $\phi2$ | $\phi1$ | $\phi2$ | $\phi1$ | $\phi2$ | $\phi1$ | $\phi2$ |
|---|---|---|---|---|---|---|---|---|
| $Y_{OUT}$ | 1 | | -1 | | 1 | | 1 | |
| $Y_{FB}$ | 1 | 1 | 0 | 0 | 0 | 0 | 1 | 1 |
| $Y_{CMP}$ | X | 1 | 0 | -1 | 0 | 1 | 1 | 1 |

US 11,451,239 B2

POWER REDUCTION AND PERFORMANCE ENHANCEMENT TECHNIQUES FOR DELTA SIGMA MODULATOR

CROSS-REFERENCE TO RELATED APPLICATIONS

This application is a 35 U.S.C. § 371 National Stage Application of PCT/US2018/067635, filed on Dec. 27, 2018, which claims priority to U.S. Provisional Application Ser. No. 62/611,586, filed on Dec. 29, 2017, the disclosures of which is hereby are incorporated herein by reference in their entirety.

TECHNICAL FIELD

The disclosure is related in general to data converters, such as analog-to-digital converters (ADC) and digital-to-analog (DAC) converters, and, in particular, to delta sigma modulators for such data converters.

BACKGROUND

Delta-sigma modulation is a popular technique for realizing high-resolution ADCs and digital-to-analog converters (DAC). It is beneficial to reduce the power consumption and improve the performance of delta-sigma modulators (ΔΣM).

DETAILED DESCRIPTION

Figures 1, 2:
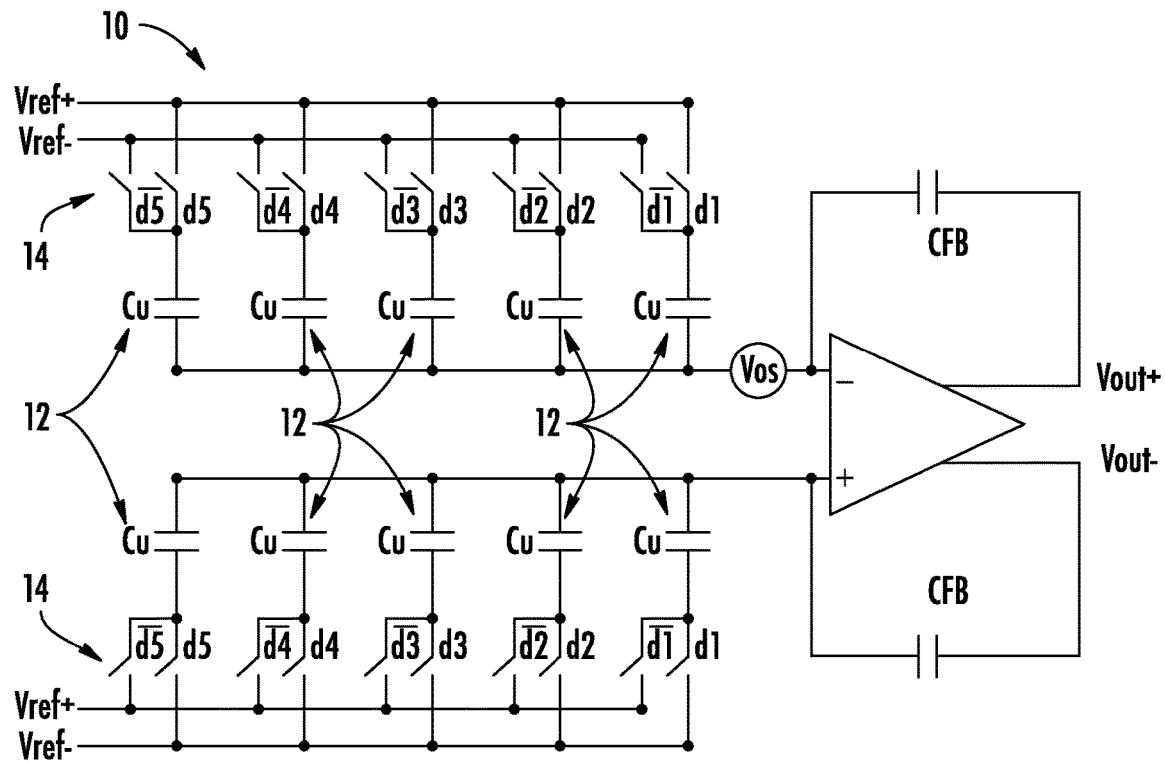
FIG. 1 shows a general implementation of digital-to-analog converter (DAC) in a discrete-time (DT) delta-sigma modulator (DSM or ΔΣM).
FIG. 2 is a table showing a DAC switching scheme in conventional DT DSM.

For the purposes of promoting an understanding of the principles of the disclosure, reference will now be made to the embodiments illustrated in the drawings and described in the following written specification. It is understood that no limitation to the scope of the disclosure is thereby intended. It is further understood that the present disclosure includes any alterations and modifications to the illustrated embodiments and includes further applications of the principles of the disclosure as would normally occur to a person of ordinary skill in the art to which this disclosure pertains.

The present disclosure proposes techniques for reducing power consumption and improving performance of delta sigma modulators and delta sigma ADCs. As discussed in more detail below, these techniques include reference scaling, op-amp balancing and chopper stabilization at the sampling frequency.

This disclosure presents a low-power delta-sigma ADC that uses a reference scaling technique that reduces the thermal noise and lower power dissipation by approximately 50%. Referring to FIG. 1, previously known multi-bit over-sampling delta-sigma ADCs often use switched capacitor feedback DACs 10 having 2-level (+1, −1) unit elements 12 (e.g., capacitors). As depicted in FIG. 1, the unit elements 12 are driven by reference voltages $V_{ref-}$ or $V_{ref+}$. The output of the DAC is the sum of the voltages of the actuated unit elements 12, which forms the feedback analog signal that substantially represents the digital output signal.

Switches 14 are used to connect the unit elements to either $V_{ref-}$ or $V_{ref+}$. The switches 14 are controlled in accordance with a DAC code. The DAC code is typically provided by the output of the quantizer of the ADC. FIG. 2 summarizes a typical switching sequence for a DAC such as depicted in FIG. 1. In the embodiment of FIG. 1, the DAC has six codes represented by +5, +3, +1, −1, −3, and −5.

As can be seen in FIG. 2, for a DAC code of +5, the switches for the five unit element 12 (pairs) has a control state of "1" so that each unit element is driven by $V_{ref+}$. For a DAC of +3, four out of five switches have a control state of "1" so that four unit elements are driven by $V_{ref+}$ while the switch for the fifth unit element has a control state of "0" so that the unit element associated with that switch is driven by $V_{ref-}$. For a DAC code of +1, three switches have a control state of "1" and two switches have a control state of "0". For DAC codes −1, −3 and −5, the control states of the switches are reversed with respect to DAC codes +1, +3 and +5, respectively.

As can be seen in the last column of the table of FIG. 2, the offset error charge for each DAC code is the same, e.g., $-5V_{os}C_u$. This is because each of the reference capacitors is always connected to active circuitry regardless of the control state of the switches. As a result, the thermal noise and power consumption of the reference capacitors is always a factor in the operation of the device.

This disclosure proposes a reference scaling technique that enables a significant reduction in thermal noise and power consumption of the delta-sigma modulator. In particular, the delta-sigma ADC in accordance with this disclosure is configured to have a 3-level (+1, 0, −1) switched-capacitor feedback DAC architecture in which each reference capacitor has the ability to be driven by either $V_{ref-}$, $V_{ref+}$ or not connected to active circuitries.

Figures 3, 4:
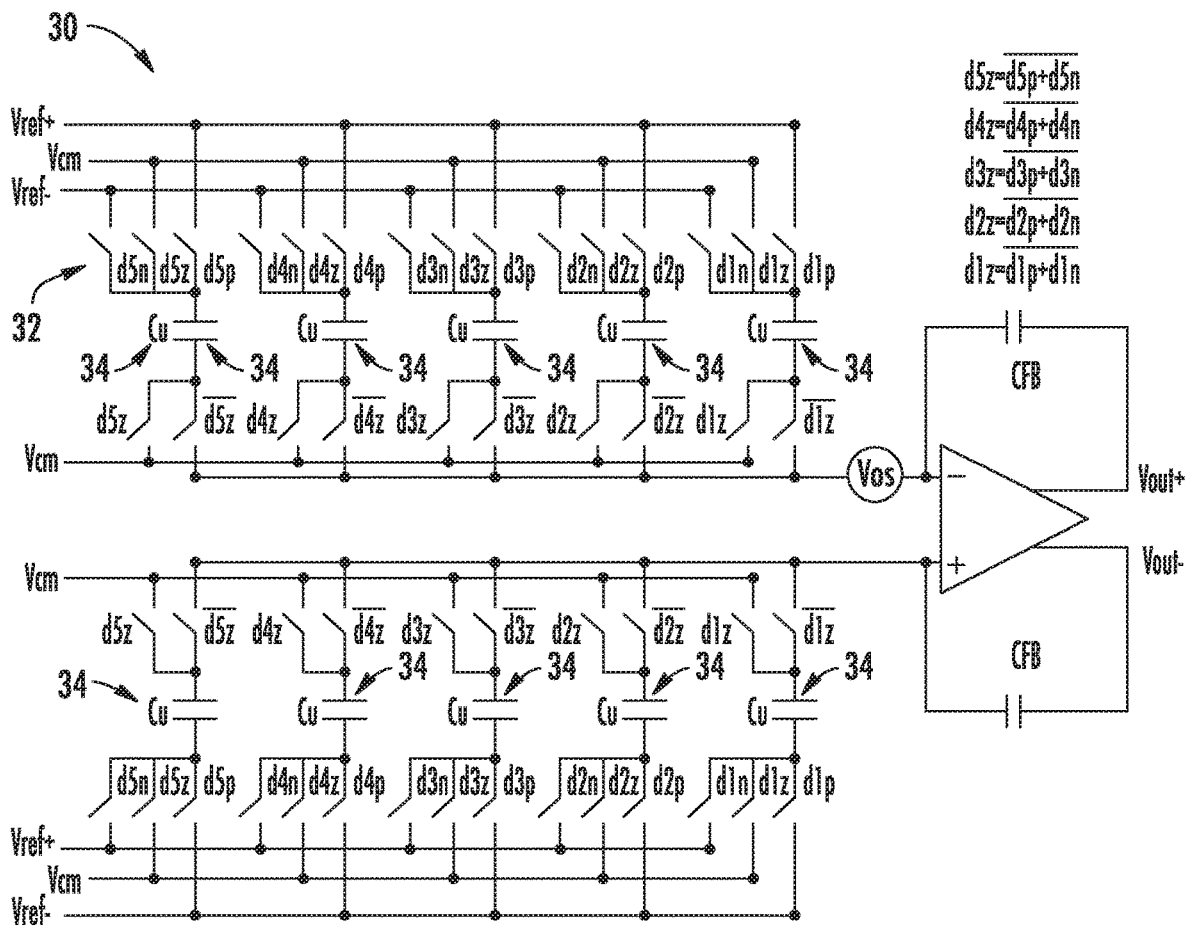
FIG. 3 depicts a multi-bit reference scaling technique in accordance with the present disclosure.
FIG. 4 is a table showing a DAC switching sequence in DT DSM with reference scaling.

An example implementation of the proposed reference scaling technique is shown in FIG. 3 while the switching sequences for different DAC control codes are summarized in the table depicted in FIG. 4. As can be seen in FIG. 3, the DAC 30 includes a switched capacitor network 32 with a plurality of unit element (reference capacitor) pairs 34. There are five unit element pairs 34 in the embodiment of FIG. 3.

The switch network 32 includes a plurality of switches associated with each unit element which are configured to electrically connect the unit element so as to provide a reference voltage, either $V_{ref-}$ or $V_{ref+}$ to the output circuitry. For example, the first unit element includes switches d1n and d1p for connecting the unit element to $V_{ref-}$ and $V_{ref+}$, respectively; the second unit element includes switches d2n and d2p for connecting the unit element to $V_{ref-}$ and $V_{ref+}$, respectively; and so on.

Each unit element also includes switches dxz for electrically disconnecting the unit element from the output circuitry. For example, the first unit element includes switches d1z and $\overline{d1z}$ for disconnecting the unit element Cu1 from the output circuitry; the second unit element includes switches d2z and $\overline{d2z}$ and for disconnecting the unit element from the output circuitry; and so on. In the embodiment of FIG. 3, the switches dxz are configured to connect the corresponding unit element to the common mode voltage $V_{cm}$.

The unit elements of FIG. 3 have control states given by "1/0", "0/1" and "0/0" which are the control states of the switches dxn, dxp associated with the unit element. A unit element with the control state of "1/0" is connected to $V_{ref+}$ and produces a signal level of +1. Similarly, a unit element with the control state of "0/1" $V_{ref-}$ and produces a signal level of −1. On the other hand, when an element is in the "0/0" state, it is not connected to active circuitry, and, therefore, delivers no signal charge and thermal noise charge to the circuitry. This leads to a significant reduction of the thermal noise contribution from the element.

FIG. 4 is a table showing the control states for the unit element switches corresponding to DAC codes +5, +3, +1, −1, −3, and −5. The offset error charge depends on the number of unit elements which are connected to the active circuitry. Therefore, the offset error charge is reduced for lower DAC code values, as can be seen in the last column of the table of FIG. 4. For small signals, only a small number of unit elements is attached to the virtual ground, resulting in effective thermal noise reduction. This technique can lower the power dissipation of an ADC by approximately 50%.

A critical side effect of the tri-level unit element feedback DAC is the loss of intrinsic linearity enjoyed by the two-level system. This non-linearity causes different degrees of performance degradation and is discussed for two different cases, i.e. even number of quantization levels and odd number of quantization levels.

If the feedback DAC input has even number of quantization levels, such as depicted in FIG. 3, the system has good signal-to-noise ratio (SNR) and signal-to-noise-and-distortion ratio (SNDR) for small signals, where only DAC codes of +1 and −1 are used. As the signal becomes larger triggering the usage of more DAC codes, SNDR degradation occurs due to DAC non-linearity but is acceptable for applications where SNDR requirements relax with increasing signal power, such as in MEMS microphones.

Figure 5:
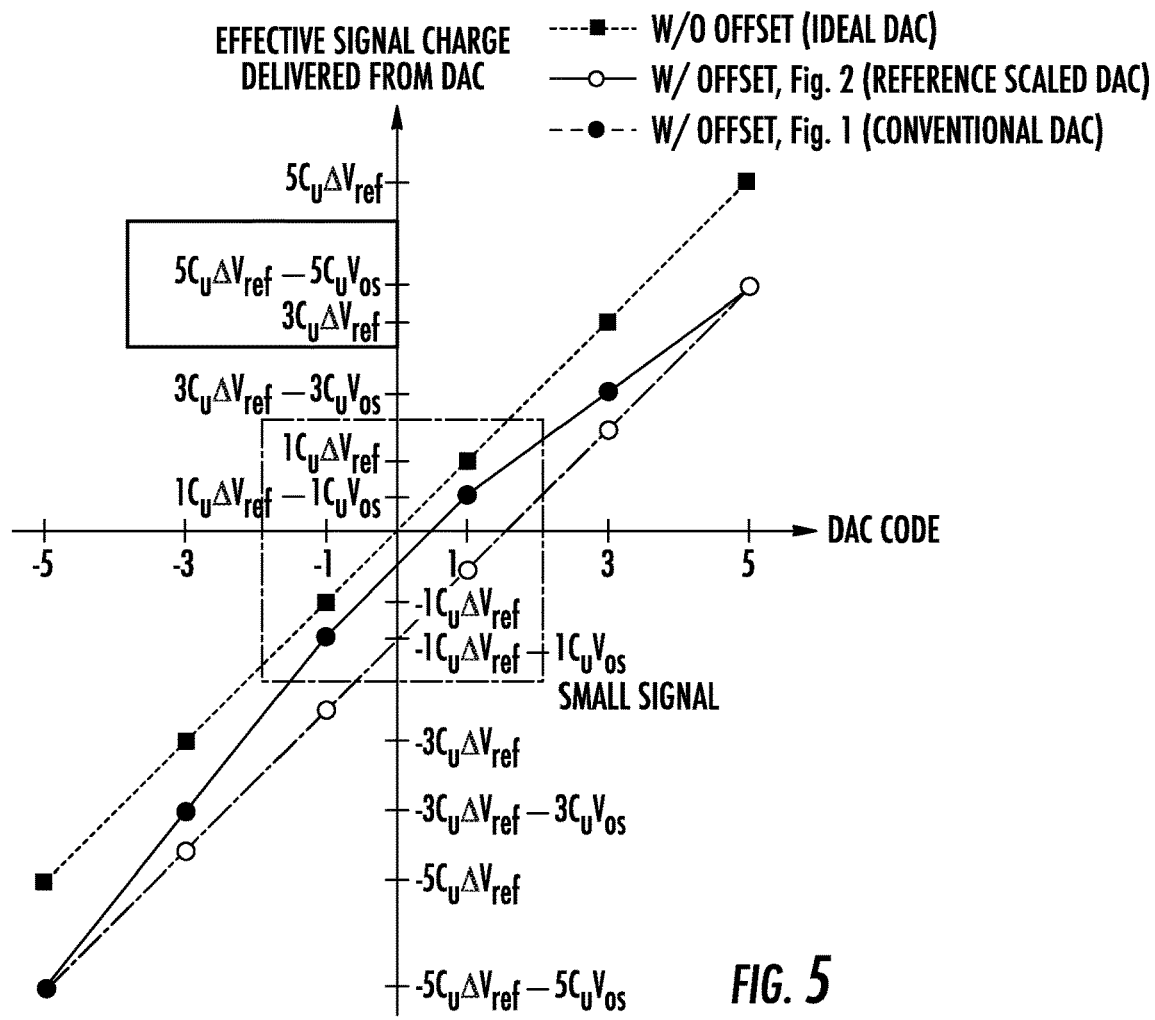
FIG. 5 shows DAC input code vs. output charge for a reference scaled System with even number of quantization level.
Figure 6:
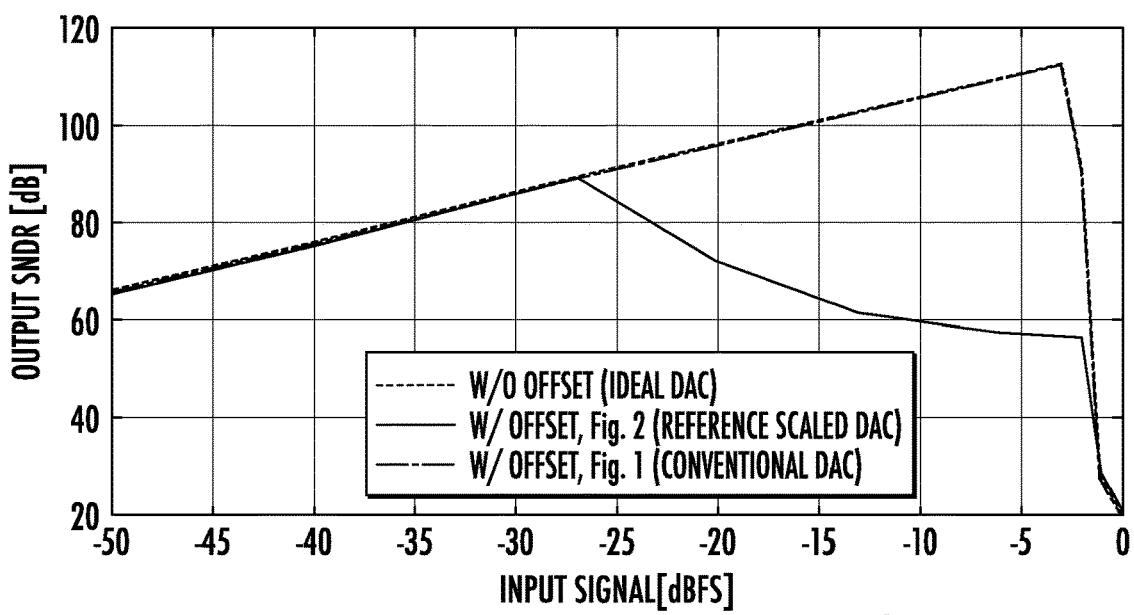
FIG. 6 is a graph showing simulated dynamic range comparison for the cases discussed in reference to FIG. 5.

FIG. 5 shows the cause of this degradation by illustrating the input and output mapping of a feedback DAC using reference scaling for an even number of quantization levels. The corresponding SNDR for each case as a function of input level is shown in FIG. 6. In FIG. 6, the ideal curve is shown in the dashed line, in which the effective charge for a DAC code of n is given by $(nC_u\Delta V_{ref})$, where $\Delta V_{ref}=V_{ref+}-V_{ref-}$. With the presence of offset in the integrator ($V_{os}$ in FIG. 3), the effective charge delivered by the feedback DAC becomes $(nC_u\Delta V_{ref}-|n|C_uV_{os})$, a non-linear mapping as shown in the solid curve of FIG. 5. For a conventional DAC without reference scaling, the offset is independent of the signal, merely introducing a DC offset to the mapping, and therefore causes no harm to the SNDR.

As can be seen from FIG. 5, for this particular design of reference scaling with even number of quantization levels, the DAC and consequently the ADC behaves as a single-bit ADC for small input signals. The inherent linearity of the single-bit DAC grants good performance at low signal levels. As the DAC input grows beyond the single bit level, the slope change causes non-linearity and deteriorates SNDR as shown in FIG. 6. For certain applications, e.g. audio systems, where SNDR requirements relax with increasing signal power, the non-linearity due to reference scaling in the feedback DAC input with an even number of quantization levels is acceptable.

Figures 7, 8:
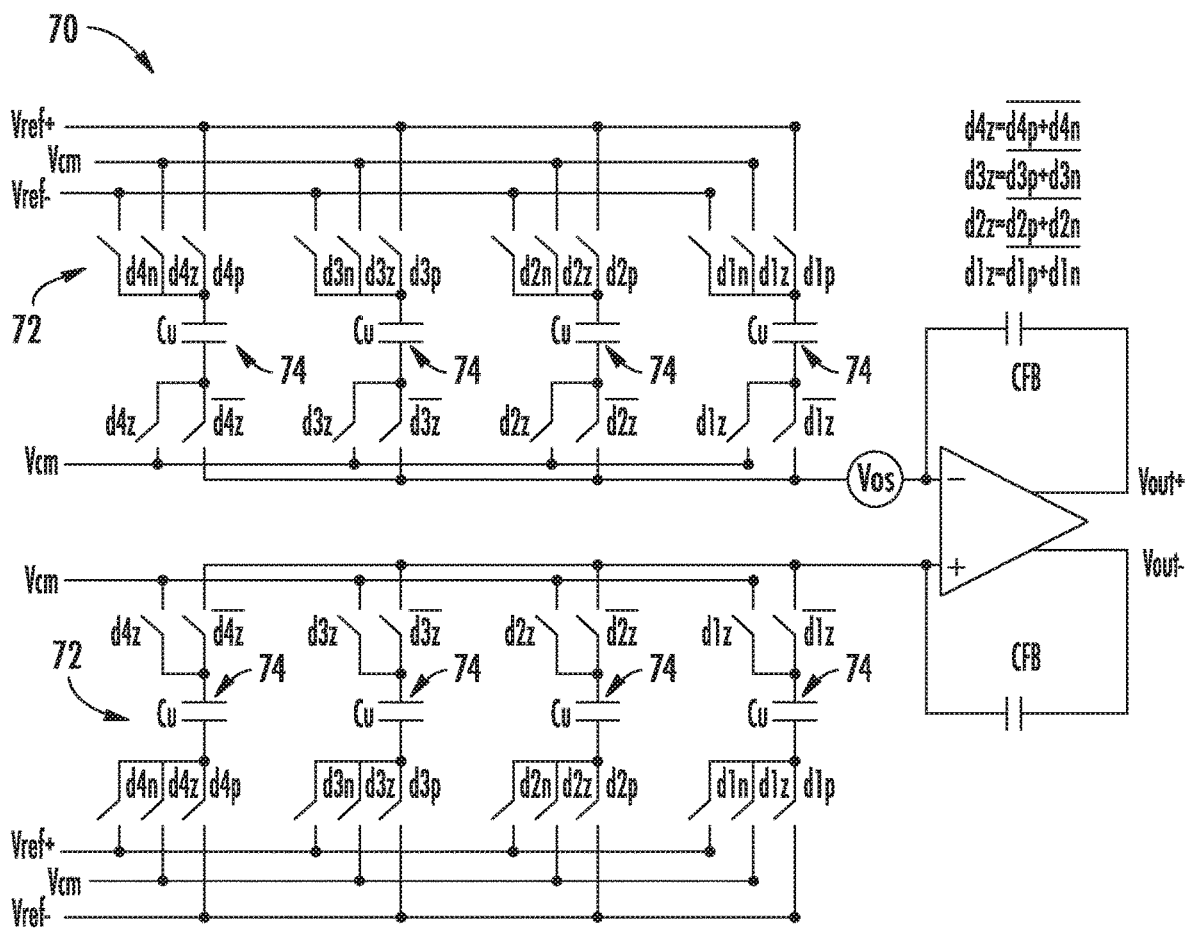
FIG. 7 depicts a multi-bit reference scaling technique for odd number of quantization levels in accordance with the present disclosure.
FIG. 8 is a table showing DAC switching sequence in DT DSM with reference scaling for odd number of quantization levels.

FIG. 7 shows an example implementation of reference scaling for an odd number of feedback DAC quantization levels. In this embodiment, four unit element pairs 74 are used in the switched capacitor network 72 of the DAC 70. The switch network 72 is otherwise similar to the switch network of the embodiment of FIG. 3. Switches dxn, dxp are used to connect the unit element to $V_{ref+}$ and $V_{ref-}$, respectively, and switches dxz are configured to disconnect the unit element from the active circuitry by connecting the unit element to the common mode voltage $V_{cm}$.

The corresponding switching sequences are summarized in the table shown in FIG. 8 for different DAC codes. To implement an odd number of quantization levels, the unit elements are according to DAC codes +4, +2, 0, −2 and −4. The unit elements have a control state of "1/0" to provide a +1 signal level to the output and a control state "0/1" to provide a −1 signal level to the output.

Figure 9:
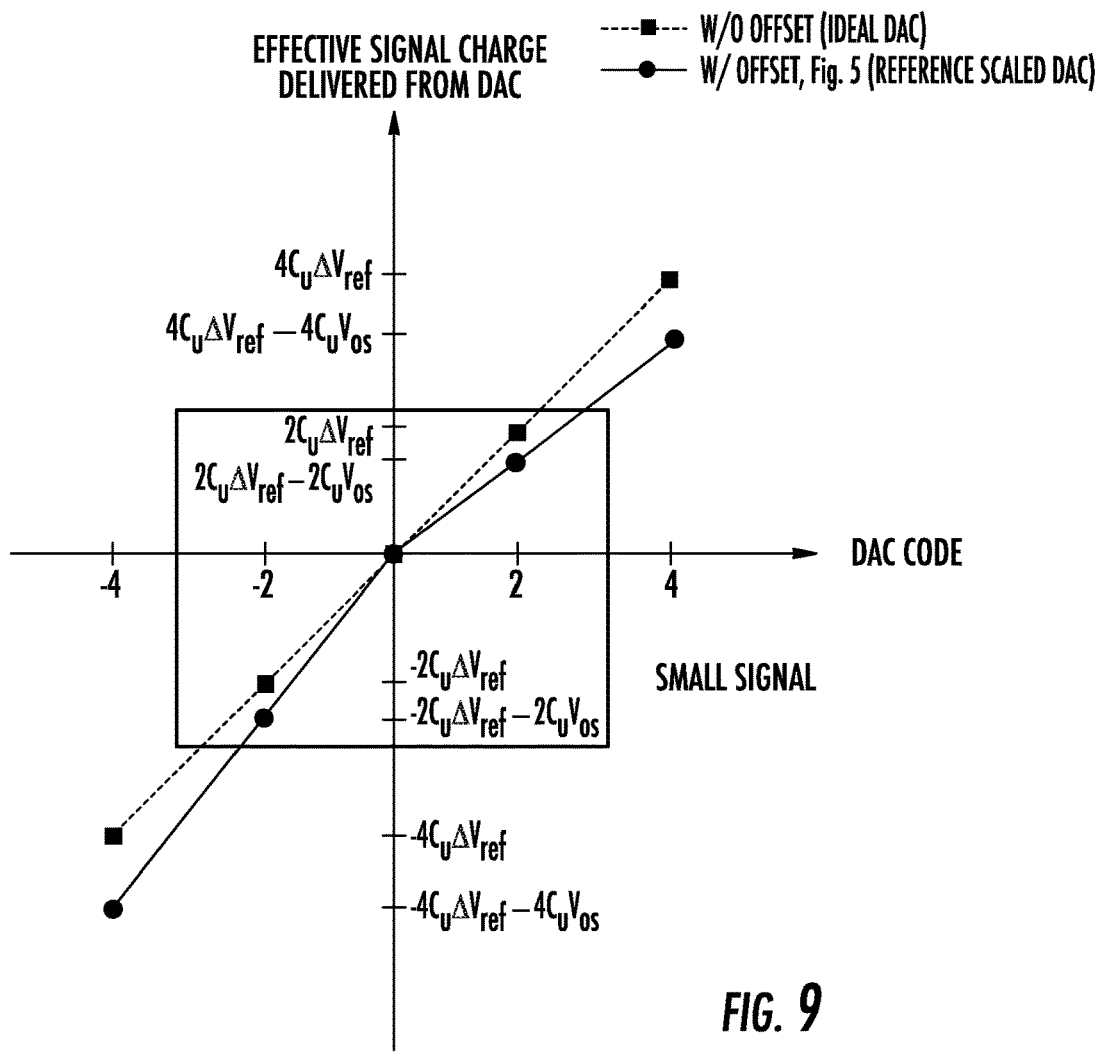
FIG. 9 is a plot showing DAC input code vs. output charge for a reference scaled system with odd number of quantization levels.
Figure 10:
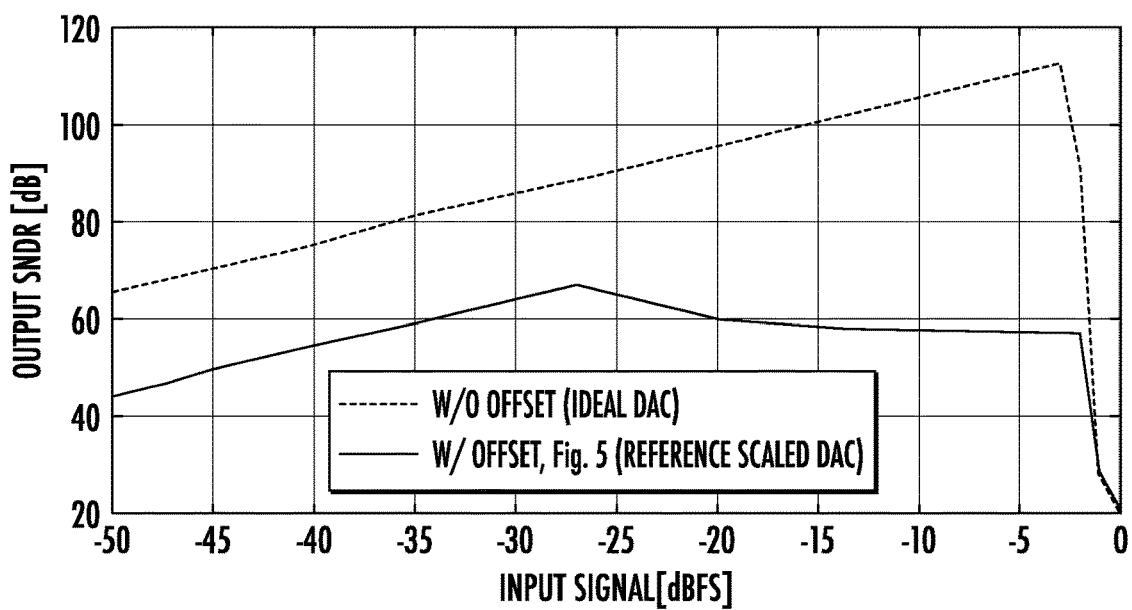
FIG. 10 is a graph showing simulated dynamic range comparison for the cases discussed in reference to FIG. 9.

FIG. 9 shows the input and output mapping of a feedback DAC, such as depicted in FIG. 7, using reference scaling for odd number of quantization levels. For the DAC code 0, all of the unit elements have a control state of "0/0" and therefore are disconnected from the active circuitry. This results in no offset error voltage at DAC code 0. As a result, the reference scaling along with offset causes non-linearity at zero crossing. As a result, the SNDR is affected at both small signals and large signals, which is illustrated in FIG. 10.

In summary, the presence of amplifier offsets causes non-linearity in a reference scaled multi-bit DAC. An op-amp balancing technique is proposed below to address the non-linearity issues associated with reference scaling. But first, a reference scaling technique for single-bit delta-sigma modulators will be discussed.

Conventionally, a single-bit delta sigma ADC has only one quantizer, whose output is either +1 or −1. In other words, the DAC either transfers a charge proportional to $+V_{ref}$ or $-V_{ref}$. In order to apply reference scaling, a tri-level feedback, i.e. [+1, 0, −1], is required.

To generate the third level, the following scheme is proposed. When the input signal is small, the output stream of DSM has large density of alternating +1 and −1 pairs, which conceptually nulls the feedback signal and is equivalent to a "0" state in a three-level design. Therefore, the idea is to design a finite-impulse response (FIR) filter to detect alternating +1 and −1 pairs from the output. Upon detection of such an event, the 1-bit DAC is disabled (i.e. not connected to the ADC input summing node), effectively realizing reference scaling.

Figure 11:
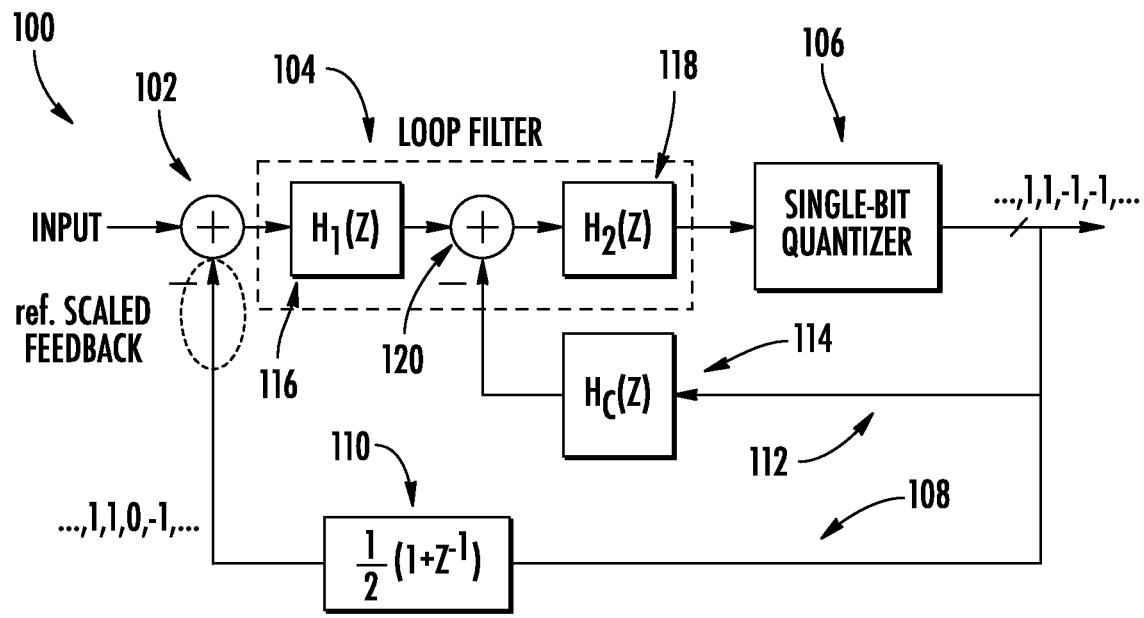
FIG. 11 depicts a block diagram of a reference scaled single-bit delta-sigma modulator.

FIG. 11 shows an example implementation of this idea. The delta-sigma modulator 100 of FIG. 11 includes a summing node 102, a loop filter 104, a single-bit quantizer 106 and a feedback path 108 with a FIR filter 110. The summing node 102 receives an analog input signal and a feedback signal from the FIR filter 110 and outputs a summed signal to the loop filter 104. The loop filter 104 filters the summed analog signal according to a noise shaping function and outputs a filtered analog signal to the single-bit quantizer 106. The quantizer 106 quantizes the analog signal and outputs a stream of bits with value +1 or −1.

The FIR filter 110 processes the quantizer output according to a transfer function $1/2(1+z^{-1})$ before being sent to the DAC. In the case of small input signals, in which the quantizer output has a large density of alternating +1 and −1 pairs, the filter output generates a large density of zeroes, thus inserting a 0 value into the DAC code.

Figure 12:
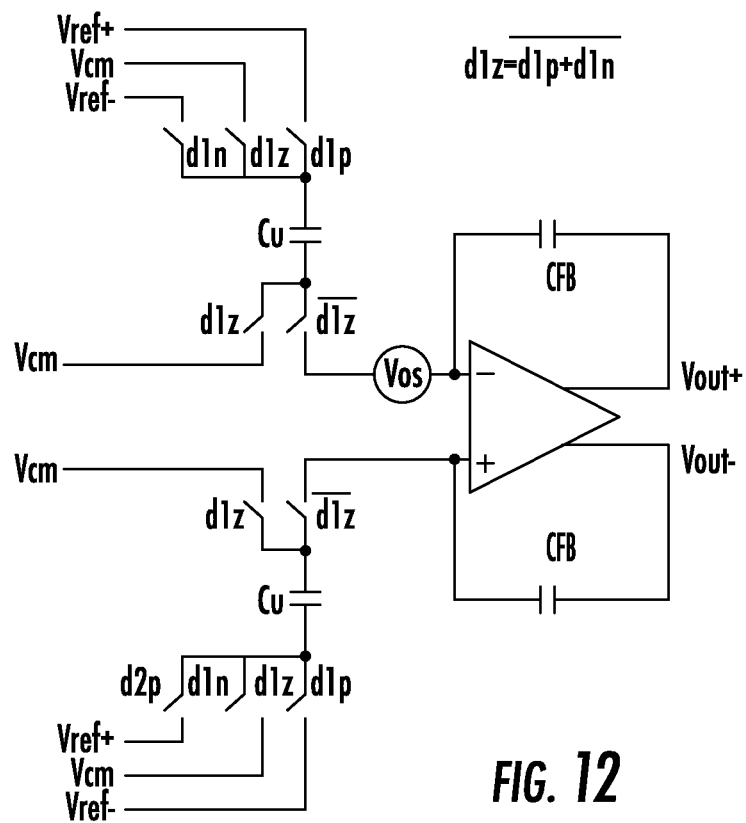
FIG. 12 is a schematic depiction of circuit implementation of the delta-sigma modulator of FIG. 11.

Referring to FIG. 12, the circuit realization of the three-level reference-scaled feedback, [+1, 0, −1], is similar to FIG. 7 with a single pair of unit elements and having DAC codes +1, 0 and −1 which are provided in the output from the FIR filter. DAC code +1, for example, would result in a control state of "1/0" for driving the unit element with $V_{ref+}$, and DAC code −1 would result in a control state of "0/1" for driving the unit element with $V_{ref-}$. DAC code 0 would result in a control state of "0/0" for the unit element with the unit element being disconnected from the active circuitry.

Adding a filter 110 in the feedback path 108 alters the originally designed noise transfer function. Therefore, a compensation feedback path 112, which taps at a different point of the loop, is introduced in the delta-sigma modulator 100. This is illustrated in FIG. 11 as a compensation feedback path 112 and compensation filter 114. The loop filter 104 is divided into a first integrator 116 and a second integrator 118. A summing node 120 receives the output of the first integrator 116 and a compensation feedback signal from the compensation filter 114. The second integrator 118 receives the output of the summing node 120, and the single-bit quantizer 106 receives the output of the second integrator 118.

Figure 13:
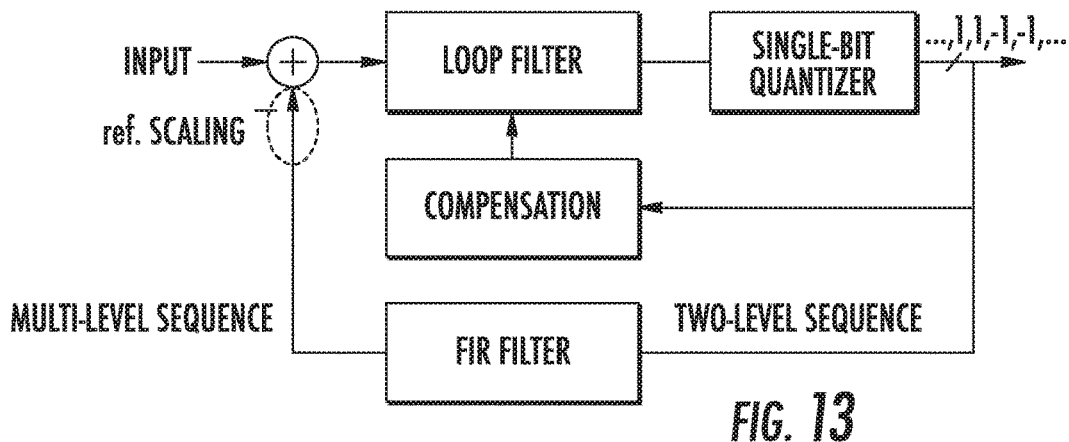
FIG. 13 depicts a block diagram of generalized reference scaling implementation for a single-bit delta-sigma modulator.

The compensation feedback path 112 taps into the loop filter 104 at the summing node 120 between a first integrator 116 and the second integrator 118. The transfer function of the compensation filter 114 depends on the transfer function of the loop filter 104. When the first integrator is a delaying integrator having a transfer function $z^{-1}/(1-z^{-1})$, the transfer function of the compensation filter 114 is given by $1/2(z^{-1})$. When the first integrator 116 is a non-delaying integrator having a transfer function $1/(1-z^{-1})$, the transfer function of the compensation filter 114 is given by $1/2$. By using the compensation filter 114, the original noise transfer function is restored. A generalized block diagram of the FIR feedback for single-bit DSM is shown in FIG. 13.

Figure 14:
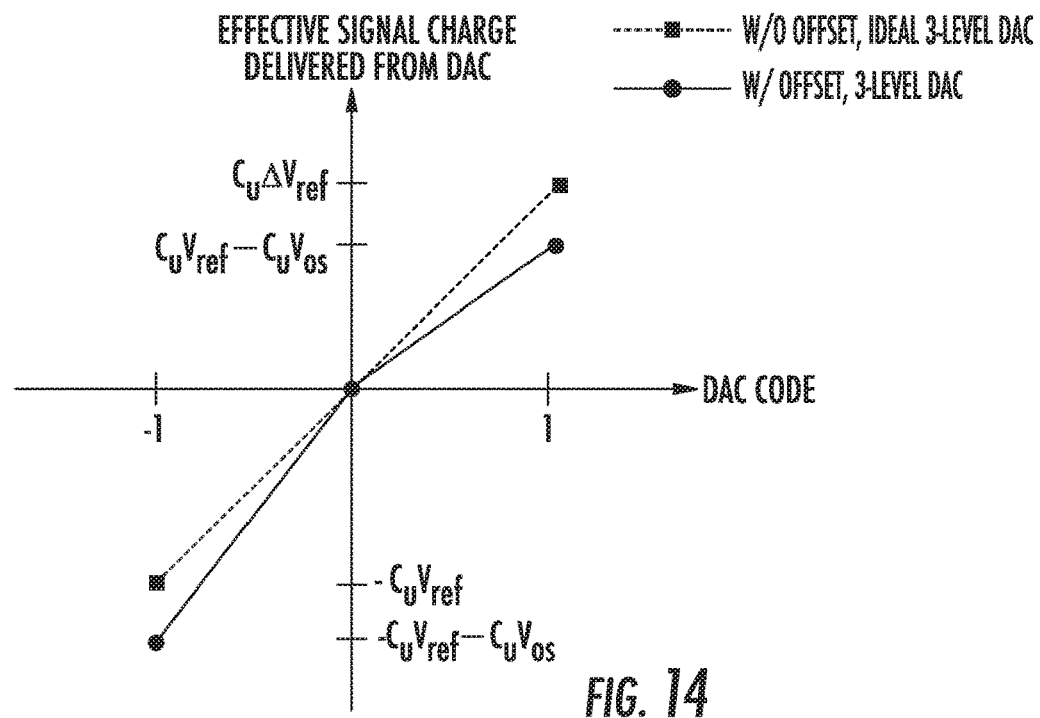
FIG. 14 is a plot showing DAC input code vs. output charge for a reference scaled system with tri-level quantization.

Similar to the multi-bit delta-sigma modulator with an odd number of quantization levels, the tri-level feedback DAC in the single-bit delta-sigma modulator causes nonlinearity as shown in FIG. 14 by the input and output mapping for the feedback DAC of FIG. 11.

Figure 15:
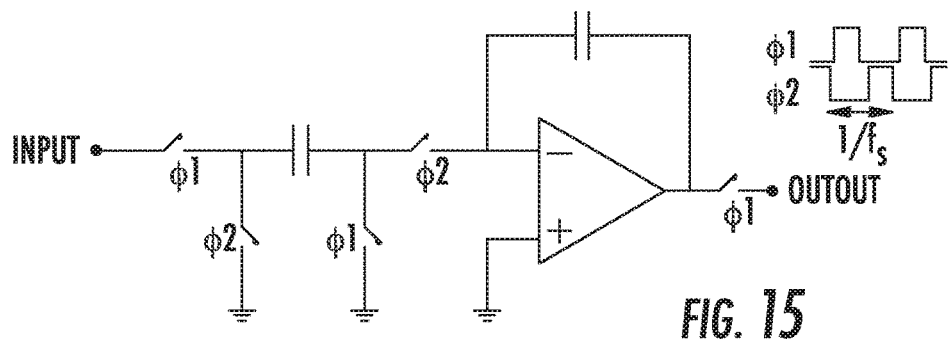
FIG. 15 is a block diagram of a conventional discrete-time integrator.

An op-amp balancing technique is proposed to address the non-linearity due to reference scaling. FIG. 15 shows a conventional integrator in a discrete-time (DT) delta-sigma modulator, which is driven according to two non-overlapping clock phases φ1 and φ2. The input charge is sampled in one clock phase (φ1 in FIG. 15) and is integrated in the next clock phase (φ2 in FIG. 15). What this means is that the power of the integrator is wasted during the signal sampling phase, as the Op-Amp is idling and performing no task.

Figure 16:
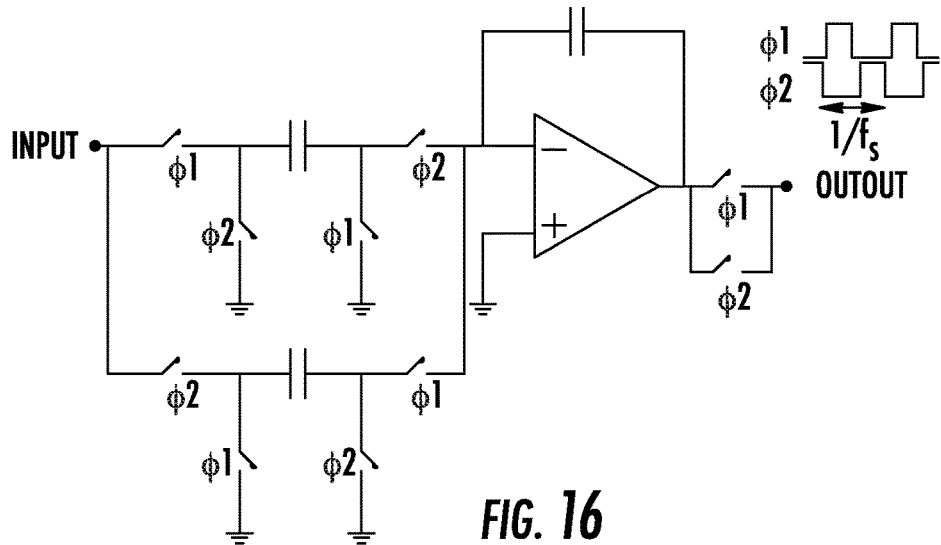
FIG. 16 is a block diagram of a double-sampling discrete-time integrator.

To avoid such an idle state of the Op-Amp, the sampling capacitance is split into two parts, an upper path 160 and a lower path 162 as illustrated in FIG. 16. While the upper capacitor path 160 is sampling the input, the lower capacitor path 162 is integrating the charge at φ1, and vice versa at φ2. Such a system gives a 3 dB advantage in power compared to a similar data-rate conventional architecture. Also, the signal is integrated at twice the frequency compared to the conventional integrator. This technique, when used in delta-sigma modulators, is known as a "double-sampling".

A major disadvantage of double-sampled delta-sigma modulators is the folding of high frequency shaped noise due to the mismatch of the DAC capacitance in φ1 and φ2. The mismatch in the DAC capacitances in φ1 and φ2 modulates the input by a discrete cosine signal, which is clocked at $2f_s$ and has its frequency equal to $f_s$ (refer to FIG. 16). Hence, the integrator output is the sum of the input and a modulated version of the input.

The sampling frequency for double-sampled delta-sigma modulators is given by $2f_s$. The signal injected into the first integrator is composed of two parts, the input signal and the feedback from the DAC. The input signal is usually low-frequency content band-limited by an antialiasing filter. Therefore, its modulated component is at frequency band near the frequency $f_s$ and is greatly attenuated by a later digital low-pass filter, thus causing little consequence to the performance. On the other hand, the feedback signal from the DAC has a large high-frequency quantization noise power at the frequency $f_s$, i.e. half of the effective sampling frequency, which is $2f_s$ for a double sampled DSM. As a result, the quantization noise is mixed down to the baseband and increases the in-band noise power, hence decreasing the SNR drastically.

Figure 17:
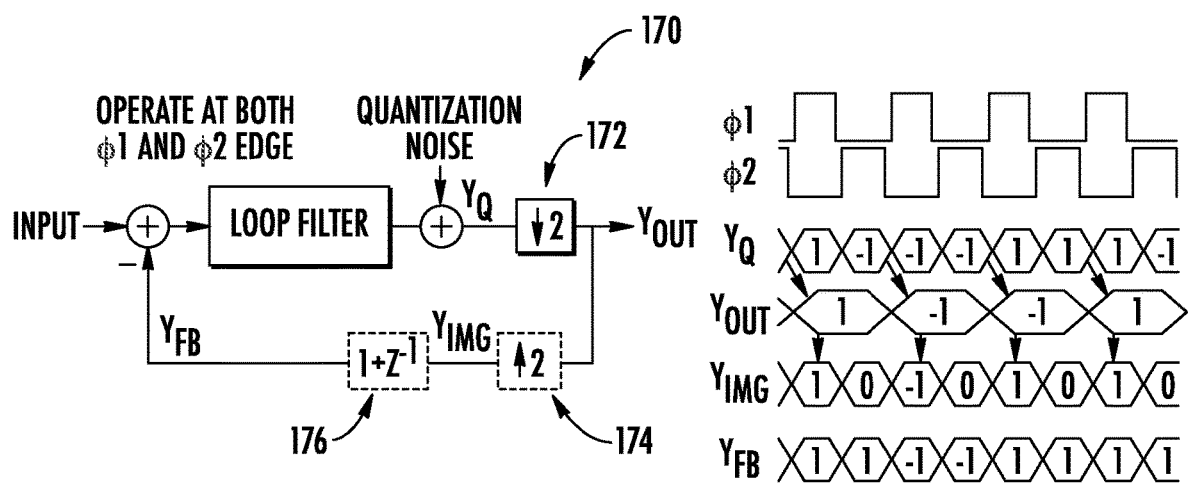
FIG. 17 depicts an example of DSM using Op-Amp balancing loop filter design.

In order to solve this issue, an "Op-Amp balancing" technique is proposed. The major difference in this technique is that the DAC value is held at the same level in φ1 and φ2 for a sampling period. FIG. 17 illustrates a delta-sigma modulator 170 using Op-Amp balancing integrators, in which the output of the quantizer, $Y_Q$, is down-sampled 172 (represented by $Y_{OUT}$, $Y_{FB}$) before feeding back to the input node. An imaginary intermediate node, $Y_{IMG}$, is inserted to assist the analysis of the frequency domain conversion between $Y_{OUT}$ and $Y_{FB}$.

Figure 18:
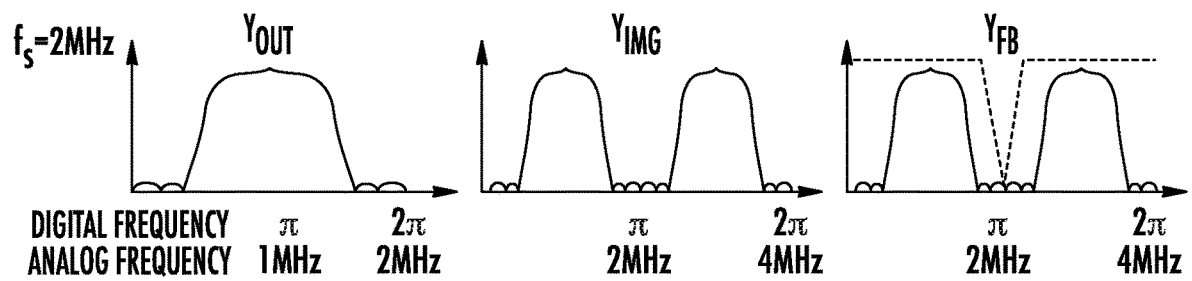
FIG. 18 shows spectral analysis of the DSM (FIG. 17) using Op-Amp balancing loop filter.

FIG. 18 shows the frequency-domain response at different nodes. For conversion between different clock domains, $Y_{OUT}$, which has a noise-shaped spectrum with its peak at p, is firstly up-sampled (174, FIG. 17), e.g., by a factor of two using zero insertion. In the frequency domain, it is equivalent to compressing the spectrum of $Y_{OUT}$ as shown by the spectrum at $Y_{IMG}$. The up-sampling 174 is followed by a holding filter (176, FIG. 17), having a holding filter function $1+z^{-1}$, to repeat (or hold) the same DAC signal for φ1 and φ2. This filter effectively nulls the frequency content of the feedback signal at $f_s$, making the system immune from the degradation due to aforementioned capacitive mismatch issue.

Figure 19:
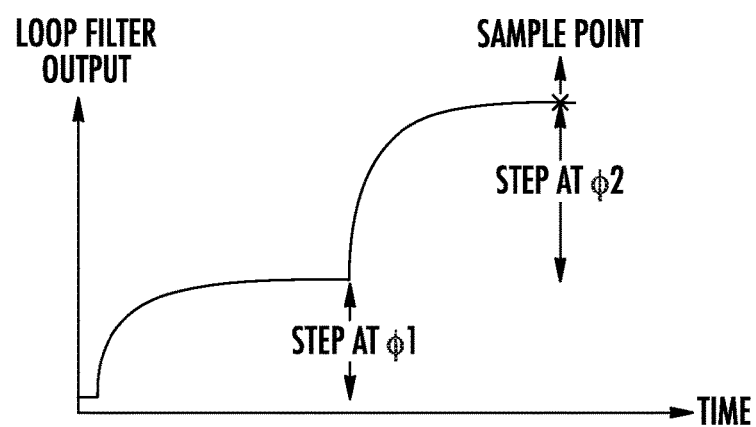
FIG. 19 is a time-domain illustration of the DSM (FIG. 17) using Op-Amp balancing loop filter.

FIG. 19 gives a time-domain perspective of this immunity. Due to the capacitor mismatch in φ1 and φ2, the output step size is different. As only the samples of the quantizer ($Y_Q$ in FIG. 17) at φ2 are taken into account for generating feedback signal, this difference in the step size does not cause any noise degradation in band.

The proposed Op-Amp balancing can reduce the power consumption for delta-sigma ADC by 50%. In addition, it solves the issue of DAC noise folding due to the capacitance mismatch in conventional double-sampling delta-sigma ADC.

Figure 20:
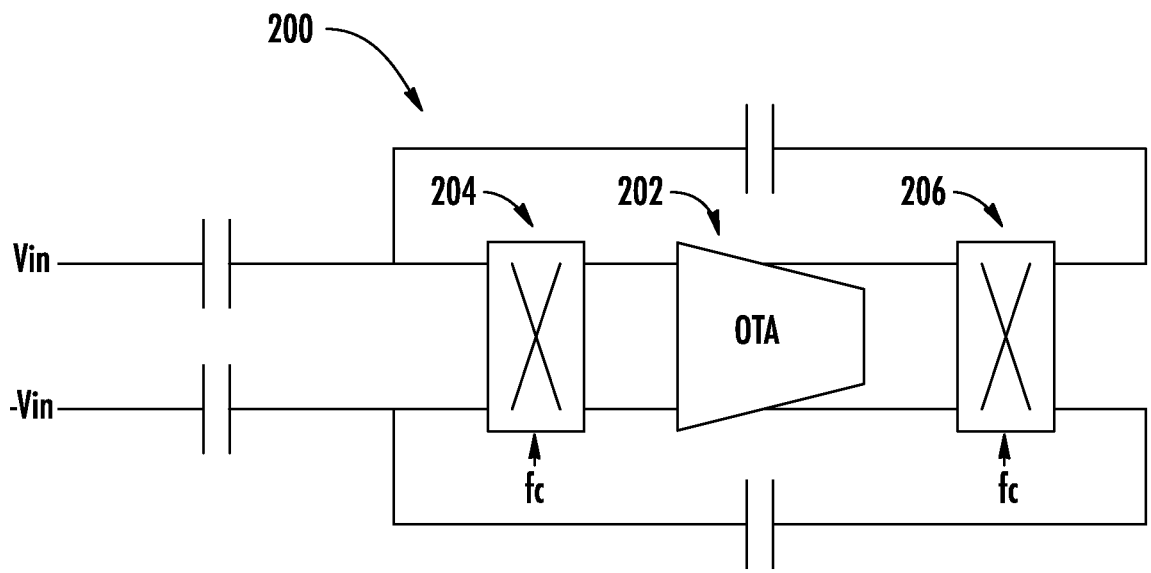
FIG. 20 is a simplified example of a chopper stabilized differential DT integrator.

The low frequency DC offset and l/f noise cannot be filtered out by a low-pass filter, and, as such, this noise will be passed through the filter with the signal information. One approach to minimize the low-frequency noise in an ADC utilizing a delta-sigma modulator is to chop the operational transconductance amplifier (OTA) and to modulate its flicker noise out of the signal band as shown in FIG. 20. As depicted in FIG. 20, the integrator 200 of the delta-sigma modulator may include an OTA 202, an input chopper 204 and an output chopper 206.

The chopping frequency of the choppers needs to be at-least an order of magnitude away from the signal bandwidth to avoid the residual flicker noise from corrupting signal bandwidth. Unfortunately, the quantization noise of a DSM is already drastically increased at frequency one order-or-magnitude away from signal bandwidth, especially for higher order loop filter design. Consequently, although the chopper stabilization itself acts to minimize the low frequency noise, there exists the possibility for the high frequency quantization noise to be modulated downward into the baseband of the modulator, leading to severe degradation in SQNR and decrease in dynamic range of the converter.

If the OTA can be chopper stabilized at a chopping frequency equal to the sampling frequency $f_s$, this would avoid quantization noise being modulated down from high frequencies into the baseband since the DAC noise transfer function has a null at the sampling frequency (see $Y_{OUT}$ in FIG. 18). The conventional discrete time delta-sigma modulator can only be chopped at a "maximum" rate of $f_s/2$. For those of ordinary skill in the art, it is evident that Op-Amp balancing in accordance with this disclosure allows chopping at the sampling frequency $f_s$. Hence we can enjoy the benefits of chopping without having the concerns of quantization noise folding.

Performance degradation due to the DAC non-linearity in a reference-scaled system under the presence of offset voltage is effectively solved by using the proposed Op-Amp balancing and the $f_s$ chopping discussed above. The mechanism of how the combination of these two techniques eliminates offset-induce DAC error is explained in the following paragraph.

Figure 21:
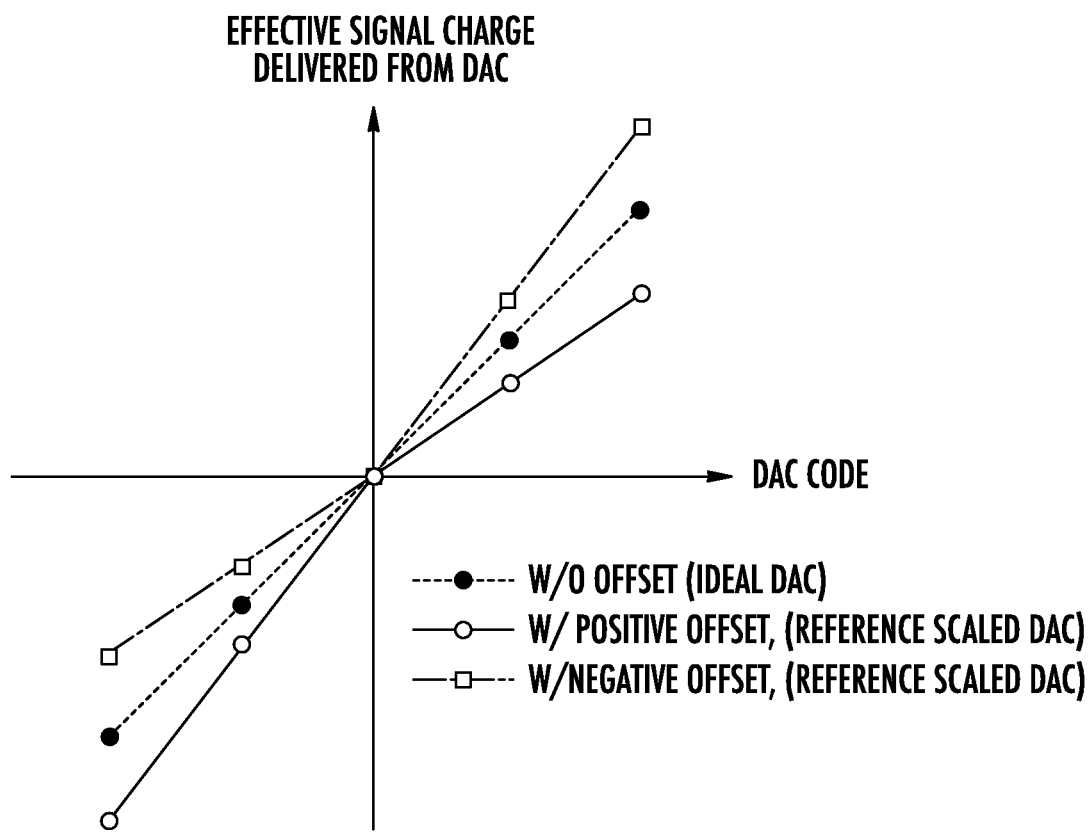
FIG. 21 shows a DAC mapping function for positive and negative offset.

Conceptually, Op-Amp balancing forces the same code for φ1 and φ2, and chopping at the sampling frequency $f_s$ implies that the DAC experiences offset error of the opposite polarity and the same magnitude for φ1 and φ2. The corresponding DAC mapping function for each case is shown in FIG. 21. The resulting effect is an averaged wave form (dotted line), which is linear.

Figure 22:
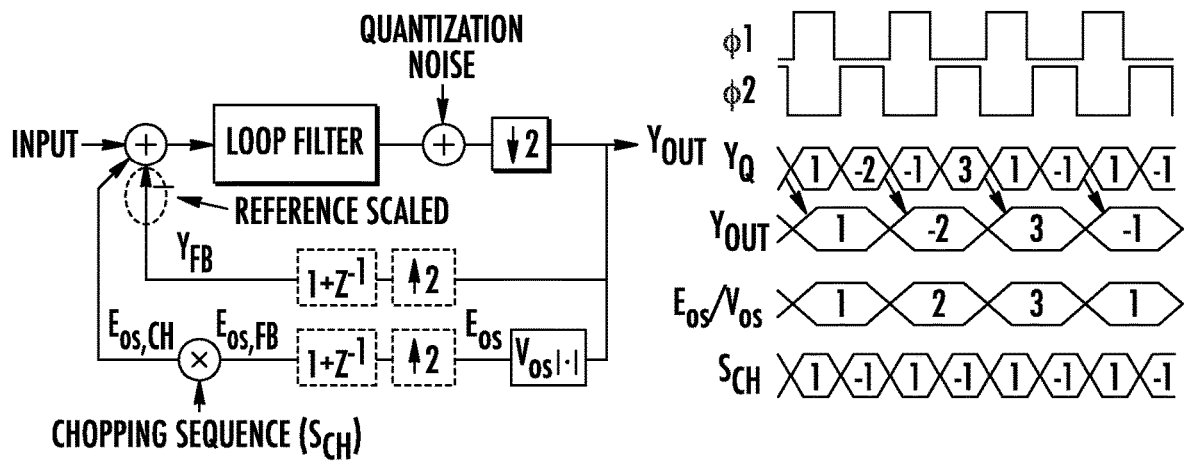
FIG. 22 is a model of the DAC offset in Op-Amp balancing loop filter design.

An explanation of this removal mechanism based on spectral analysis is presented for a deeper understanding. The error induced by the DAC non-linearity, given by $$E_{OS}(Y_{out})=V_{os}|Y_{out}|,$$

is modeled as an additional feedback path to the input as shown in FIG. 22. Note that this example is based on a multi-bit delta-sigma modulator, combining reference scaling, Op-Amp balancing and sampling frequency $f_s$ chopping. The single-bit implementation is discussed below. The described analysis for multi-bit implementation can be easily extended to the single-bit implementation.

Figure 23:
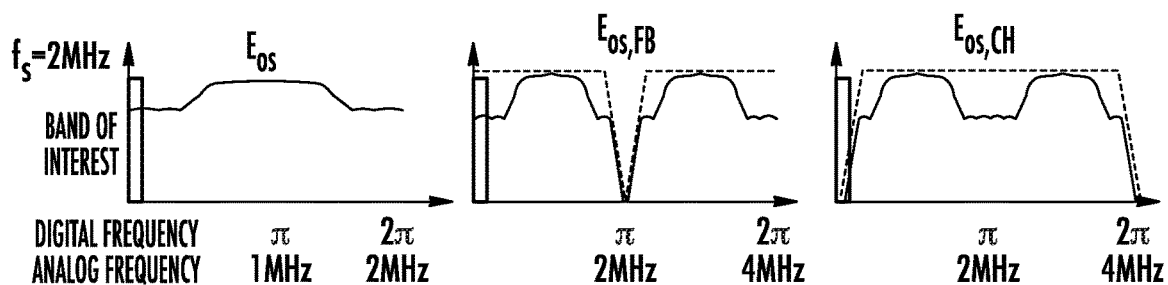
FIG. 23 shows spectral analysis of the DSM using Op-Amp balancing loop filter.

Based on the model in FIG. 22, FIG. 23 illustrates the frequency response of this error term, $E_{os}$, showing a distorted noise-shaped spectrum with an increased noise floor at the low frequency, which corrupts our band of interest. The inherent filter $(1+z^{-1})$ in the Op-Amp balancing scheme re-shapes this noise and creates a null at $f_s$ (see $E_{OS,FB}$). The subsequent $f_s$ chopping (represented by the chopping sequence, $S_{CH}$) shifts the null to the baseband (see $E_{OS,CH}$). As a result, the error due to the DAC non-linearity is attenuated at the baseband and becomes negligible.

Figure 24:
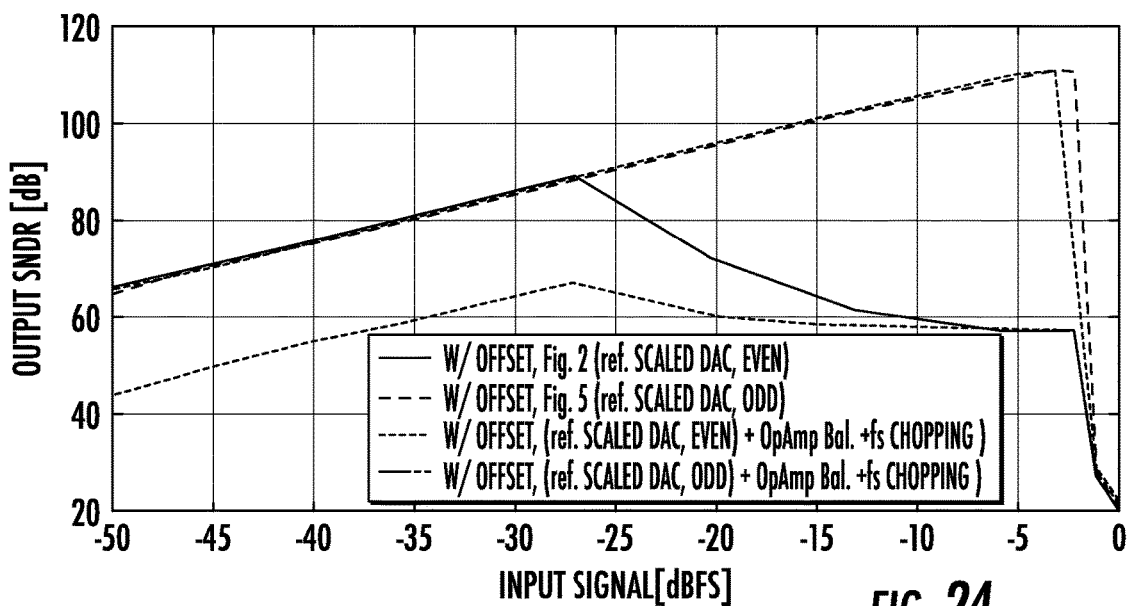
FIG. 24 shows a simulated dynamic range comparison for multi-bit ADC combining the proposed techniques.

The SNDR degradation when using standalone reference scaled DAC with both the even and odd number of quantizer levels has been discussed above. FIG. 24 compares those performances with our implementation combining reference scaling, Op-Amp balancing and $f_s$ chopping. It is evident that the SNR degradation is fully recovered with the proposed techniques.

Figures 25, 26, 27:
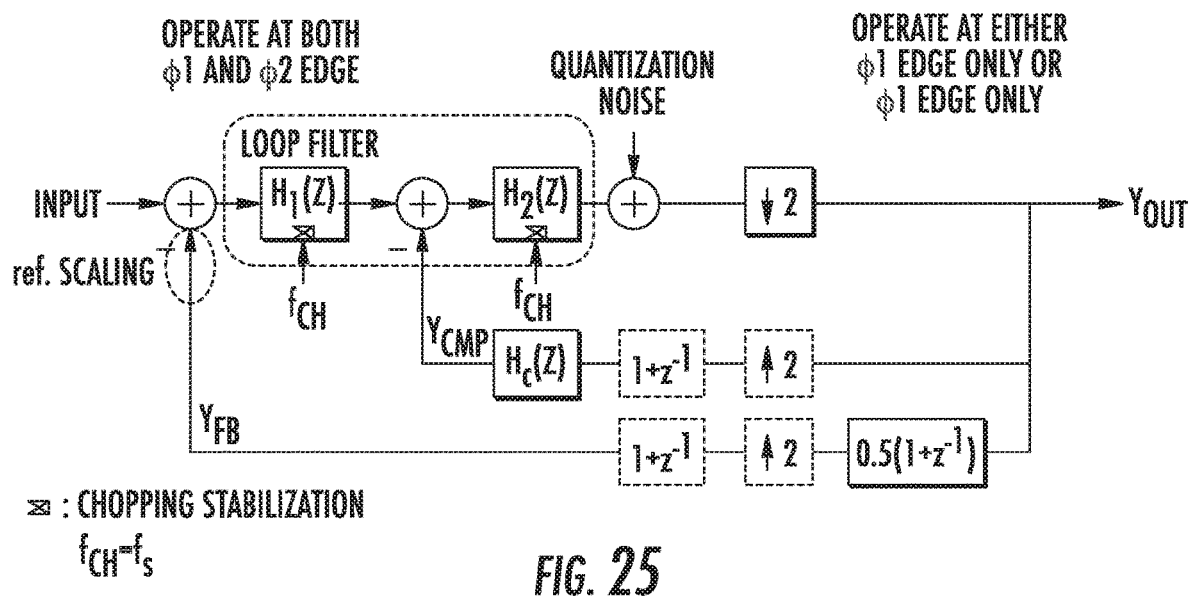
FIG. 25 shows a single-bit DSM with reference scaling, Op-Amp balancing and chopping.
FIG. 26 is a table showing compensation for delaying and non-delaying integrators
FIG. 27 shows an example of signal transition based on FIG. 22 with non-delaying integrator in H1(z).

FIG. 25 shows the block diagram of a single-bit DS ADC, using reference scaling, Op-Amp balancing and $f_s$ chopping. A first-order FIR filter, $0.5(1+z^{-1})$, is applied in the feedback path to enable reference scaling (described in Section 1.3) while a compensation path is added to ensure the recovery of the loop filter design. The table depicted in FIG. 26 summarizes the compensators for a delaying integrator and a non-delaying integrator design. It is important to note that while the FIR filter is clocked at $f_s$, the compensators need to be clocked at $2f_s$.

An example of the signal transitions at $Y_{OUT}$, $Y_{FB}$ and $Y_{CMP}$ of FIG. 25 are given in Table 6 assuming the case of a non-delaying integrator in $H_1(z)$. Several characteristic can be observed from the feedback signal, $Y_{FB}$, in this example and is the result of our techniques, which are recapped as the follows.

The FIR feedback produces a DAC code 0 and a control state "0/0" resulting in no reference capacitors being attached to the active circuitry, effectively reducing the thermal noise contribution on feedback path.

The Op-Amp balancing scheme force the same feedback codes from φ1 to φ2 so that the delta-sigma modulator is immune from capacitor mismatch between the sampling capacitors and enables $f_s$ chopping.

The combination of Op-Amp balancing and $f_s$ chopping further eliminates the offset-induced DAC non-linearity issue associated with the reference scaled DAC.

Unlike $Y_{FB}$, $Y_{CMP}$ is not guaranteed to have the same code from ϕ1 to ϕ2 due to the compensator. This violation of the Op-Amp balancing scheme makes $Y_{CMP}$ suffer from the offset-induced DAC non-linearity. In order to avoid any performance degradation from this issue, the compensator function is implemented in the analog domain such that the DAC of the compensation path is directly controlled by $Y_{OUT}$, which is a two-level signal, +1 and −1. Consequently, no reference scaling implies no DAC non-linearity issue. Since the noise from the compensation is noise-shaped by the first integrator, its contribution is inherently small in the DSM even without the help from reference scaling.

While the disclosure has been illustrated and described in detail in the drawings and foregoing description, the same should be considered as illustrative and not restrictive in character. It is understood that only the preferred embodiments have been presented and that all changes, modifications and further applications that come within the spirit of the disclosure are desired to be protected.

What is claimed is:

1. A delta sigma analog-to-digital converter (ADC), comprising:
a delta-sigma modulator including:
a first summing node for summing an analog input signal and a feedback signal and outputting a first summed analog signal;
a loop filter that filters the first summed analog signal according to a noise shaping function and outputs a filtered analog signal;
a quantizer that quantizes the filtered analog signal and outputs a quantized output signal;
a feedback path that connects an output of the quantizer with an input of the summing node; and
a feedback DAC on the feedback path that receives the quantized output signal and converts the quantized output signal into the feedback signal which is supplied to the first summing node, and
wherein the feedback DAC includes a switched capacitor circuit, the switched capacitor circuit including a plurality of unit elements, the switched capacitor circuit being configured to selectively connect each of the respective unit elements into different connection states depending on a DAC code of the quantized output signal, the different connection states including:
a first connection state in which the respective unit element is connected to supply a first signal to an output of the feedback DAC, the first connection state corresponding to a first signal level;
a second connection state in which the respective unit element is connected to supply a second signal to the output of the feedback DAC, the second connection state corresponding to a second signal level; and
a third connection state in which the respective unit element is disconnected from the output of the feedback DAC and connected to a common mode voltage, the third connection state corresponding to a third signal level.

2. The delta-sigma ADC of claim 1, wherein the feedback DAC is a single-bit DAC and the quantizer is a single-bit quantizer.

3. The delta-sigma ADC of claim 2, further comprising:
a finite-impulse response (FIR) filter that filters the quantized output signal before it reaches the feedback DAC, the FIR filter being configured to output a filtered quantized output signal in which portions of the quantized output signal that alternate between the first value and the second value at a predetermined rate are replaced with a signal portion having a third quantization value.

4. The delta sigma ADC of claim 3, further comprising:
a compensation feedback path that connects the output of the quantizer to the loop filter; and
a compensation filter on the compensation feedback path,
wherein the loop filter has a noise transfer function,
wherein the FIR filter alters the noise transfer function, and
wherein the compensation filter compensates for the FIR filter such that the noise transfer function is restored.

5. The delta sigma ADC of claim 4, wherein the loop filter includes a first integrator that receives the first summed analog signal, a second integrator that outputs the filtered analog signal, and a second summing node,
wherein the second summing node has a first input that receives the output of the first integrator, a second input connected to the compensation feedback path, and an output connected to an input of the second integrator,
wherein the first integrator receives the first summed analog signal and outputs a first integrated analog signal to the first input of the second summing node,
wherein the compensation filter outputs a compensation signal to the second input of the second summing node,
wherein the second summing node outputs a second summed analog signal which is a sum of the first integrated analog signal and the compensation signal, and
wherein the second integrator integrates the second summed signal to form the filtered analog signal.

6. The delta sigma ADC of claim 3, wherein the FIR filter has a transfer function $1/2(1+z^{-1})$.

7. A delta-sigma modulator comprising:
a first clock phase signal and a second clock phase signal being non-overlapping with respect to each other;
a summing node that sums an analog input signal and a feedback signal;
a loop filter that filters the first summed analog signal according to a noise shaping function and outputs a filtered analog signal, the loop filter including:
a double sampling integrator including a first capacitor path and a second capacitor path, wherein the first capacitor path samples the analog input signal and the second capacitor path integrates a sample during the first clock phase signal and wherein the second capacitor path integrates a sample and the second capacitor path samples the analog input signal during the second clock phase signal;
a quantizer that quantizes the output of the of the double sampling integrator;
a feedback path that connects an output of the quantizer to the summing node; and
a holding filter on the feedback path,
wherein the first capacitor path and the second capacitor path have a first sampling frequency,
wherein the double sampling integrator has a second sampling frequency that is double the first sampling frequency,
wherein an output of the quantizer is down-sampled by a predetermined factor to form a down-sampled signal which is output to the feedback path,
wherein the down-sampled signal is up-sampled on the feedback path by the predetermined factor before being fed to the holding filter,
wherein the up-sampled signal includes DAC codes, and wherein the holding filter keeps a value of the DAC code of the up-sampled signal at a constant level during each period of the first clock phase signal and the second clock phase signal to generate the feedback signal.

8. The delta-sigma modulator of claim 7, wherein the holding filter function is $1+z^{-1}$.

9. The delta-sigma modulator of claim 8, wherein the holding filter function nulls a frequency content of the feedback signal at the first sampling frequency.

10. The delta-sigma modulator of claim 7, wherein the DAC codes indicated by the up-sampled signal during periods of only one of the first clock phase signal and the second cock phase signal are used to generate the feedback signal.

11. The delta-sigma modulator of claim 7, wherein the predetermined factor is two.

12. The delta-sigma modulator of claim 7, wherein the double sampling integrator includes an operational transconductance amplifier (OTA), an input chopper circuit for chopping an input to the OTA, and an output chopper circuit for chopping an output of the OTA,
wherein the input chopper circuit and the output chopper circuit have a chopping frequency, and
wherein the chopping frequency corresponds to the first sampling frequency.

13. A delta-sigma ADC comprising:
a first clock phase signal and a second clock phase signal being non-overlapping with respect to each other;
a delta-sigma modulator including:
a first summing node for summing an analog input signal and a feedback signal and outputting a first summed analog signal;
a loop filter that filters the first summed analog signal according to a noise shaping function and outputs a filtered analog signal;
a quantizer that quantizes the filtered analog signal and outputs a quantized output signal;
a feedback path that connects an output of the quantizer with an input of the summing node; and
a feedback DAC on the feedback path that receives the quantized output signal and converts the quantized output signal into the feedback signal which is supplied to the first summing node; and
wherein the feedback DAC includes a switched capacitor circuit, the switched capacitor circuit including a plurality of unit elements, the switched capacitor circuit being configured to selectively connect each of the respective unit elements into different connection states depending on a DAC code of the quantized output signal, the different connection states including:
a first connection state in which the respective unit element is connected to supply a first signal to an output of the feedback DAC, the first connection state corresponding to a first signal level;
a second connection state in which the respective unit element is connected to supply a second signal to the output of the feedback DAC, the second connection state corresponding to a second signal level; and
a third connection state in which the respective unit element is disconnected from the output of the feedback DAC, the third connection state corresponding to a third signal level, and
wherein the loop filter includes a double sampling integrator having a first capacitor path and a second capacitor path, wherein the first capacitor path samples the analog input signal and the second capacitor path integrates a sample during the first clock phase signal and wherein the second capacitor path integrates a sample and the second capacitor path samples the analog input signal during the second clock phase signal,
wherein the quantizer quantizes the output of the of the double sampling integrator,
wherein the feedback path includes a holding filter,
wherein the first capacitor path and the second capacitor path have a first sampling frequency,
wherein the double sampling integrator has a second sampling frequency that is double the first sampling frequency,
wherein an output of the quantizer is down-sampled by a predetermined factor to form a down-sampled signal which is output to the feedback path,
wherein the down-sampled signal is up-sampled on the feedback path by the predetermined factor before being fed to the holding filter,
wherein the up-sampled signal includes DAC codes, and
wherein the holding filter keeps a value of the DAC code of the up-sampled signal at a constant level during each period of the first clock phase signal and the second clock phase signal to generate the feedback signal.

14. The delta-sigma ADC of claim 13, wherein the switched capacitor circuit is configured to connect the respective unit element to a common mode voltage in the third connection state.

15. The delta-sigma ADC of claim 14, wherein the holding filter function nulls a frequency content of the feedback signal at the first sampling frequency.

16. The delta-sigma ADC of claim 13, wherein the double sampling integrator includes an operational transconductance amplifier (OTA), an input chopper circuit for chopping an input to the OTA, and an output chopper circuit for chopping an output of the OTA,
wherein the input chopper circuit and the output chopper circuit have a chopping frequency, and
wherein the chopping frequency corresponds to the first sampling frequency.

17. The delta-sigma ADC of claim 13, wherein the holding filter function is $1+z^{-1}$.

18. The delta-sigma ADC of claim 13, wherein the feedback DAC is a single-bit DAC and the quantizer is a single-bit quantizer, and,
further comprising:
a finite-impulse response (FIR) filter that filters the quantized output signal before it reaches the feedback DAC, the FIR filter being configured to output a filtered quantized output signal in which portions of the quantized output signal that alternate between the first value and the second value at a predetermined rate are replaced with a signal portion having a third quantization value.

19. The delta sigma ADC of claim 18, further comprising:
a compensation feedback path that connects the output of the quantizer to the loop filter; and
a compensation filter on the compensation feedback path,
wherein the loop filter has a noise transfer function,
wherein the FIR filter alters the noise transfer function, and
wherein the compensation filter compensates for the FIR filter such that the noise transfer function is restored.

* * * * *